United States Patent
Kang et al.

(10) Patent No.: US 6,759,845 B2
(45) Date of Patent: Jul. 6, 2004

(54) WEAK-MAGNETIC FIELD SENSOR USING PRINTED CIRCUIT BOARD MANUFACTURING TECHNIQUE AND METHOD OF MANUFACTURING THE SAME

(75) Inventors: Myung-Sam Kang, Daejeon (KR); Kyoung-Won Na, Yongin-si (KR); Sang-On Choi, Suwon-si (KR); Won-Youl Choi, Suwon-si (KR); Jeong-Hwan Lee, Jinhae-si (KR); Keon-Yang Park, Seoul (KR)

(73) Assignee: Samsung Electro-Mechanics Co., Ltd., Kyunggi-do (KR)

(*) Notice: Subject to any disclaimer, the term of this patent is extended or adjusted under 35 U.S.C. 154(b) by 0 days.

(21) Appl. No.: 10/140,266

(22) Filed: May 8, 2002

(65) Prior Publication Data

US 2003/0169038 A1 Sep. 11, 2003

(30) Foreign Application Priority Data

Mar. 9, 2002 (KR) .......................... 2002-12766

(51) Int. Cl.[7] .............. G01R 33/04; H01F 5/00
(52) U.S. Cl. .............. 324/253; 324/260; 336/200
(58) Field of Search ............... 324/209, 256, 324/234, 257, 258, 260, 247, 232; 336/200

(56) References Cited

U.S. PATENT DOCUMENTS

| | | | |
|---|---|---|---|
| 3,833,872 A | * | 9/1974 | Marcus et al. ............. 336/83 |
| 5,936,403 A | | 8/1999 | Tamura |
| 5,986,533 A | * | 11/1999 | Person et al. ............. 336/200 |
| 6,270,686 B1 | | 8/2001 | Tamura |
| 6,270,889 B1 | * | 8/2001 | Kataoka et al. ............ 428/352 |
| 6,293,001 B1 | * | 9/2001 | Uriu et al. ................. 29/608 |
| 6,388,551 B2 | * | 5/2002 | Morikawa ................. 336/223 |
| 6,429,763 B1 | * | 8/2002 | Patel et al. ................ 336/200 |

* cited by examiner

Primary Examiner—N. Le
Assistant Examiner—Reena Aurora
(74) Attorney, Agent, or Firm—Morgan, Lewis & Bockius LLP (57) ABSTRACT

A weak-magnetic field sensor using printed circuit board manufacturing technique and a method of manufacturing the same which detects the Earth's magnetic field to obtain positional information is disclosed. The sensor comprises a first base board which is formed at its upper and lower surfaces with first driving patterns such that the upper and lower first driving patterns are electrically connected to each other, a pair of first stacked boards which are stacked on upper and lower surfaces of the first base board and which are formed with magnetic layers to be parallel to each other and patterned in a certain shape, and a pair of second stacked boards which are stacked on outer surfaces of the pair of first stacked boards and which are formed with second driving patterns electrically connected to the first driving patterns of the first base board to surround magnetic layers and formed with pickup patterns to surround the first and second driving patterns.

23 Claims, 6 Drawing Sheets

WEAK-MAGNETIC FIELD SENSOR USING PRINTED CIRCUIT BOARD MANUFACTURING TECHNIQUE AND METHOD OF MANUFACTURING THE SAME

BACKGROUND OF THE INVENTION

1. Field of the Invention

The present invention relates to a weak-magnetic field sensor using printed circuit board manufacturing technique and a method of manufacturing the same, and more particularly to a weak-magnetic field sensor using printed circuit board manufacturing technique and a method of manufacturing the same which is adapted to be mounted on a mobile communication terminal to detect the Earth's magnetic field to obtain positional information.

2. Description of the Prior Art

In the recent trend of offering various additional information services in the spread of mobile phones and mobile terminals, a positional information service becomes established as an essential service, and more accurate and convenient services are required hereafter.

To achieve positional information, it is necessary to provide a sensor capable of precisely determining a current position. As such means for providing positional information, a weak-magnetic field sensor which is intended to detect the Earth's magnetic field to obtain positional information has been used. As a component commonly used in such a weak-magnetic field sensor, there is a flux gate sensor.

The flux gate sensor uses highly permeable magnetic strips for its core components. The flux gate sensor is comprised of a primary coil wound around one of the two magnetic cores and a secondary coil wound around the other of the magnetic cores, and is capable of recognizing a current position by detecting a difference between voltage generated from the primary coil and voltage generated from the secondary coil due to variations of magnetic fields of the cores.

Such a conventional flux gate sensor is manufactured in such a way that two cylindrical cores made of highly permeable magnetic material are wound with copper wires in a certain direction. More specifically, a copper wire as a driving coil (a primary coil) is wound around a magnetic core in a certain direction while maintaining constant spacing and pressure. Subsequently, a pickup coil (a secondary coil) is wound around the magnetic core to detect a magnetic field generated from the magnetic core due to the driving coil. As is the case with the winding of the driving coil, a copper wire as the pickup coil is wound at a constant spacing under constant pressure.

As such, such a flux gate, which is fabricated by winding copper wires, is comprised of a driving coil and a pickup coil for detecting a magnetic field generated from the driving coil. The copper coils are wound around the magnetic cores utilizing a wire coil technology well known in the art. At this point, the secondary coil must be wound to be directed in an X axis direction and an Y axis direction so as to obtain positional information of magnetic field. However, although a conventional flux gate sensor must maintain positional accuracy of a wound coil, it is difficult to maintain the positional accuracy. Since the positional accuracy is easily affected by temperature, light or surface material due to such configuration, accuracy of its attributes is deteriorated.

In addition, since the flux gate sensor is fabricated such that a coil is directly wound around a magnetic core, it has a disadvantage in that the coil is frequently cut. Moreover, since the sensor itself becomes large, it is not compatible with the trend toward miniaturization and weight reduction of electric appliances. The enlargement of the sensor requires increased electricity consumption, so that the sensor cannot achieve miniaturization and reduction of electricity consumption of electric appliances.

To overcome disadvantages of such a conventional flux gate sensor, a weak-magnetic field sensor is proposed in U.S. Pat. Nos. 5,936,403 and 6,270,686, which is manufactured in such a way that amorphous boards having circular etched portions are stacked on both upper and lower surfaces of a glass epoxy base having specific conductive patterns to form an amorphous flat board core, and glass epoxy bases etched to form X coils and Y coils are stacked on the amorphous flat board core. However, since the flux gate sensor disclosed in U.S. Pat. Nos. 5,936,403 and 6,270,686 require a process comprising preparing the amorphous flat board core by etching the amorphous boards to have circular etched portions and stacking of amorphous boards while conforming to the circular etched portions, and stacking epoxy base boards having an X coil and an Y coil etched thereon on the amorphous core, its manufacturing process is complicated and high manufacturing cost is incurred due to stacking of many amorphous boards.

SUMMARY OF THE INVENTION

The present invention has been made keeping in mind the above problems occurring in the prior art, and an object of the present invention is to provide a weak-magnetic field sensor using printed circuit board manufacturing technique and a method of manufacturing the same which can detect weak-magnetic fields with precision and provide accurate positional information.

Another object of the present invention is to provide a weak-magnetic field sensor using printed circuit board manufacturing technique and a method of manufacturing the same which is capable of meeting the need for high density mounting required in a field of application such as mobile phones by accomplishing miniaturization, excellent magnetic efficiency and low electric power consumption by an etching technique for a printed circuit board.

A further object of the present invention is to provide a weak-magnetic field sensor using printed circuit board manufacturing technique which is simply constructed, easily manufactured, and reduced in manufacturing cost by simple circuit construction and a method of manufacturing the same.

In order to accomplish the above object, the present invention provides a weak-magnetic field sensor using printed circuit board manufacturing technique comprising: a first base board—a CCL(Copper Clad Laminate) which is formed at its upper and lower surfaces with first driving patterns such that the upper and lower first driving patterns are electrically connected to each other; a first stacked board—prepregs and worked copper foils which are stacked on upper and lower surfaces of the first base board and which are formed with magnetic layers to be parallel to each other and patterned in a certain shape; and a second stacked board—prepregs and copper foils which are stacked on outer surfaces of the first stacked boards and which are formed with second driving patterns electrically connected to the first driving patterns of the first base board to surround magnetic layers and formed with pickup patterns to surround the first and second driving patterns.

Furthermore, the present invention provides a method of manufacturing a weak-magnetic field sensor using printed circuit board manufacturing technique, comprising the steps of: providing first driving patterns on upper and lower surfaces of a first base board by forming first via-holes at the first base board to connect the upper and lower driving patterns to each other followed by plating of the via-holes, exposing and etching; preparing the first stacked board by stacking and pressing prepregs, worked copper foils and magnetic bodies(amorphous metal)on both sides of the first base board followed by exposing, developing and etching; preparing the second stacked boards by stacking and pressing prepregs and copper foils on both sides of the first stacked board; forming second via-holes at the first and second stacked boards, and forming through holes at the first base board and the first and second stacked boards; and providing second driving patterns on the second stacked boards to be electrically connected to the first driving patterns by the second via-holes and to surround the magnetic cores, and providing pickup patterns on the upper and lower second stacked boards to be electrically connected to each other by the through holes and to surround the first driving patterns by plating, exposing, developing and etching the second stacked board.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

This invention will be described in further detail by way of example with reference to the accompanying drawings.

Figure 1:
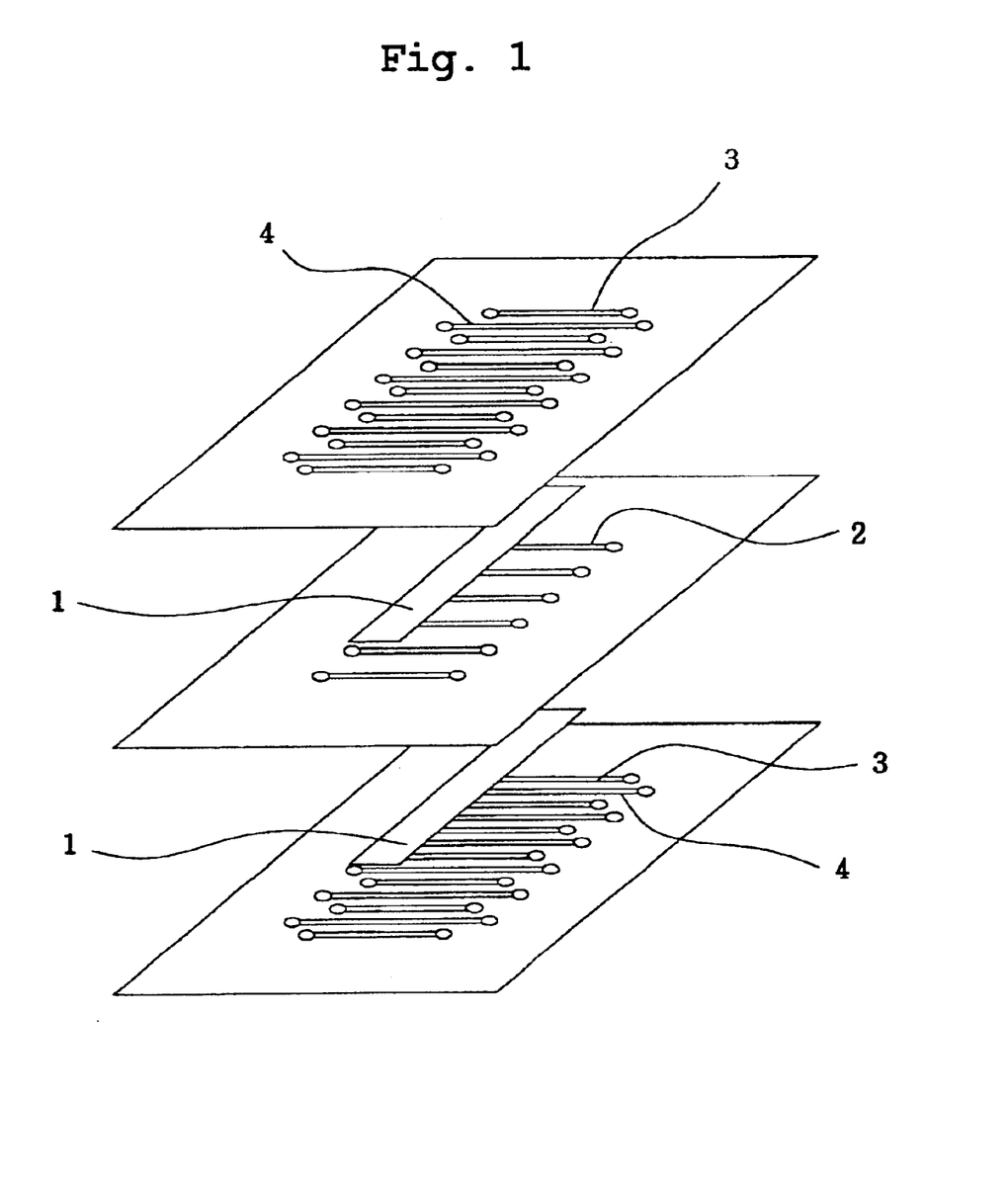
FIG. 1 is an exploded perspective view of an embodiment of a weak-magnetic field sensor using printed circuit board manufacturing technique according to the present invention.
Figure 2:
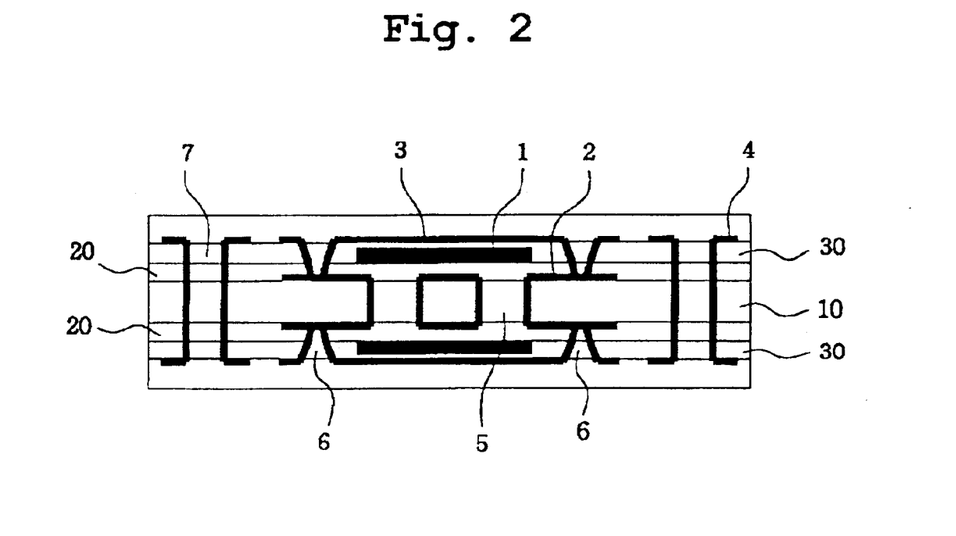
FIG. 2 is a cross-sectional view of the sensor of FIG. 1 in which the boards are stacked.

FIGS. 1 and 2 are an exploded perspective view and a cross-sectional view of an embodiment of a weak-magnetic field sensor using printed circuit board manufacturing technique according to the present invention.

As shown in the drawings, the weak-magnetic field sensor using printed circuit board manufacturing technique according to the present invention comprises a first base board 10, first driving patterns 2 formed on upper and lower surfaces of the first base board 10, a pair of first stacked boards 20 stacked on upper and lower faces of the first driving pattern 2, each of which is provided at outer surface thereof with magnetic bodies 1, and a pair of second stacked boards 30 stacked on the upper and lower first stacked boards 20, each of which is provided with a second driving pattern 3 and a pickup pattern 4.

Each of the driving patterns 2 formed at both sides of the first base board 10 is comprised of a plurality of parallel pattern lines. The upper and lower driving patterns 2 of the first base board 10 are electrically connected to each other by first via-holes 5 formed at the first base board 10. The pair of magnetic bodies 1 are placed on the upper and lower first driving patterns 2 in parallel to each other such that the magnetic bodies 1 are arranged to be perpendicular to the first driving patterns 2. The magnetic bodies 1 are patterned in band shapes. The second driving patterns 3 are arranged in the same direction as that of the first driving patterns 2. The first and second stacked boards 20 and 30 are formed with second via-holes 6 such that the first driving patterns 2 and the second driving patterns 3 surround the magnetic bodies 1.

Accordingly, the first driving patterns 2 and the second driving patterns 3 are electrically connected to each other by the second via-holes 6, and serve as coils wound around the magnetic bodies 1.

The second driving patterns 3 and the pickup patterns 4 are alternately formed at outer surfaces of the second stacked boards 30 so that the pickup patterns 4 are positioned between the second driving patterns 3. The pickup patterns 4 are sized to be longer than those of the driving patterns 2 and 3 such that the pickup patterns 4 surround the driving patterns 2 and 3. The first base board 10, the first stacked boards 20 and the second stacked boards 30 are formed with through holes 7 to electrically connect the upper and lower pickup patterns 4 so that the pickup patterns 4 surround the magnetic bodies 1.

The weak-magnetic field sensor using printed circuit board manufacturing technique is comprised of the second driving pattern and the pickup pattern (first layer), the magnetic body (second layer), the first driving pattern (third layer), the first driving pattern (fourth layer), the magnetic body (fifth layer) and the second driving pattern and the pickup pattern (sixth layer) from top to bottom in this order such that the layers are symmetrically disposed.

Figure 3:
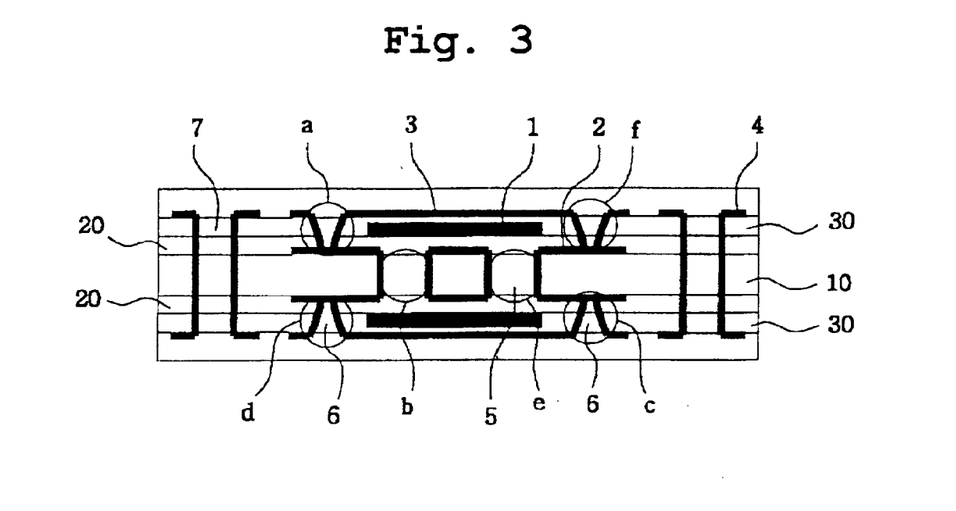
FIG. 3 is a cross-sectional view showing connection of a driving coil of a weak-magnetic field sensor using printed circuit board manufacturing technique according to the present invention.

A connecting manner of the first driving patterns 2 and the second driving patterns 3 will now be described in detail with reference to FIG. 3. The second driving pattern of the first layer as starting layer is connected to a circuit of the third layer through "f" holes and then connected to lands of "d" holes of the fourth layer through "b" holes. Subsequently, the lands are connected to a circuit of the sixth layer through the "d" holes and connected to lands of "a" holes of the third layer through "c" holes, a circuit of the fourth layer and "b" holes. The lands of the "a" holes are connected to a circuit of the first layer through "a" holes and connected to the circuit of the fourth layer through "f" holes, the third layer and "e" holes. The circuit of the fourth layer is connected to a circuit of the sixth layer through "d" holes and then connected to the first layer through "c" holes, the circuit of the fourth layer, "e" holes, the circuit of the third layer and "a" holes.

The pickup patterns of the upper and lower second stacked boards 30 are electrically connected to each other in a zigzag manner through the through holes 7 such that the pickup patterns serve as a coil wound around the magnetic bodies 1 and the first and second driving patterns 2 and 3.

In an operation of the weak-magnetic field sensor using printed circuit board manufacturing technique according to the present invention, when alternating current flows in the driving patterns 2 and 3, induction current flows in the pickup patterns 4, thereby generating a voltage difference. By detecting the voltage difference, it is possible to determine the position or orientation of the sensor.

FIGS. 4a to 4i show a process of manufacturing an embodiment of a weak-magnetic field sensor using printed circuit board manufacturing technique according to the present invention.

Figure 4A:
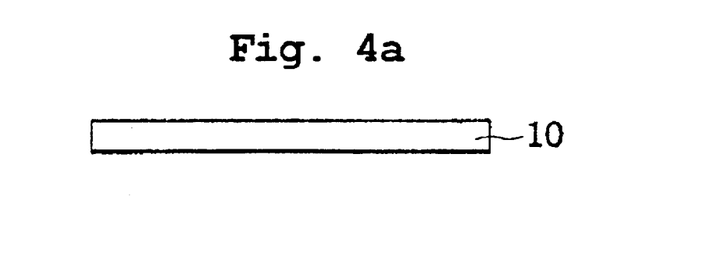
FIGS. 4a to 4i show a process of manufacturing an embodiment of a weak-magnetic field sensor using printed circuit board manufacturing technique according to the present invention.
Figure 4B:
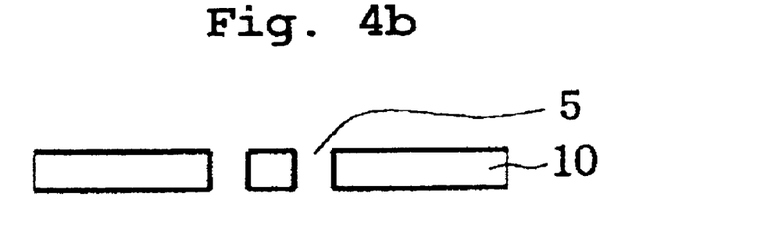
Figure 4C:
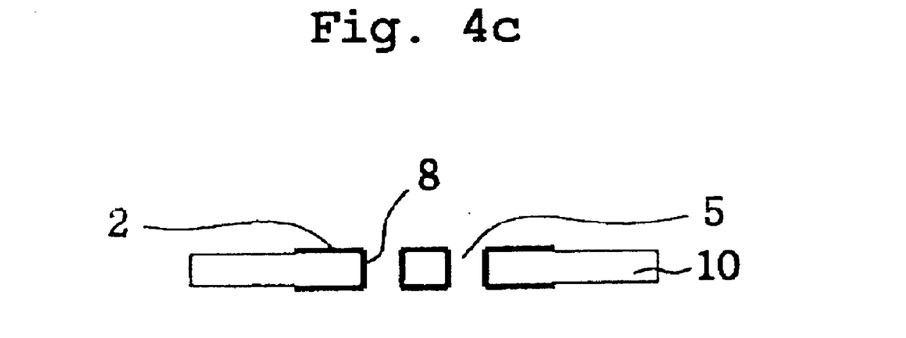

First, a first base board 10 is prepared (FIG. 4*a*). A CCL (Copper Clad Laminate) is preferably used as the first base board 10. At this point, it is preferable to form a reference hole at the first base board for convenience in subsequent procedures. The first base board 10 is formed with first inner via-holes 5, and inner surfaces of the first via-holes 5 are plated with conductive metal (i.e., copper) (FIG. 4*b*). Thereafter, the first base board 10 is formed at its both sides with a driving patterns 2 by exposure, developing and etching of known process for producing printed circuit boards (FIG. 4*c*). The first driving patterns 2 are connected to a later-described second driving patterns 3 to surround the magnetic bodies 1. At this point, it is preferable that an upper driving pattern of the first driving patterns 2 forms only a circuit required to be extended upward, and a lower driving pattern of the first driving patterns 2 forms only a circuit required to be extended downward. Since the upper and lower first driving patterns 2 are connected to each other by the via-holes 5, the connecting portions of the first driving patterns 2 are formed with lands 8.

Subsequently, the first driving patterns 2 are formed with magnetic layers using a stacking method. At this point, to precisely position the magnetic bodies 1, worked copper foils 21 are punched at portions on which the magnetic bodies are placed.

Figure 4D:
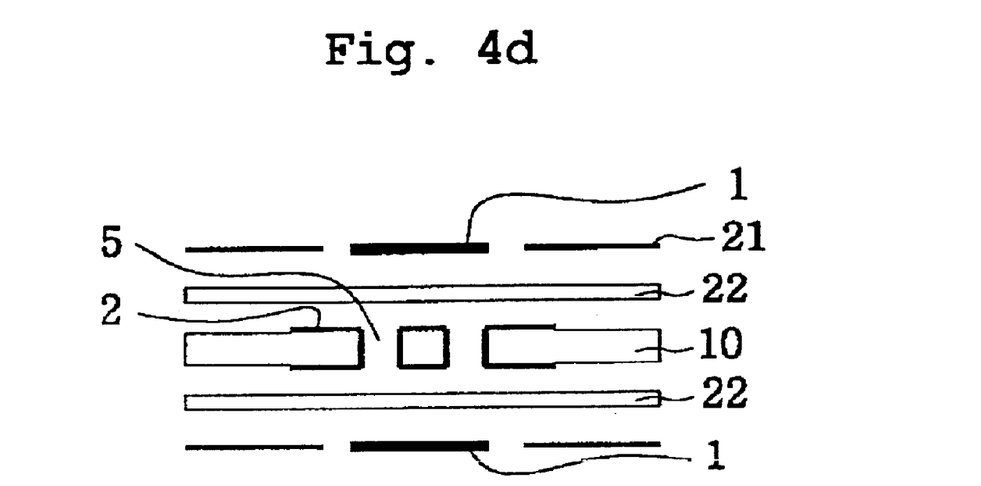

To laminate the magnetic bodies, second base layers 22 and worked copper foils 21 are placed on the core board, and magnetic layers 1 are placed on the worked portions. The second base layers 22 are preferably prepregs which are partially cured, and, for example, are selected from a group consisting of FR-4, FR-4 having high glass transition temperature (Tg), bismaleimide-triazine (BT) epoxy resin and so on, which are well known in the art. Material of the magnetic layers 1 is selected from a group consisting of amorphous metal, Permalloy and Supermalloy but the amorphous metal is preferable among the metals. It is preferable that thickness of the copper foils falls in a range of 12–18 $\mu$m, and thickness of the prepregs falls in a range of 60–100 $\mu$m.

As such, the second base layers 22, worked copper foils 21 and magnetic layers 1 are subjected to a preliminary lay-up procedure in this order (FIG. 4*d*), and are pressed at high temperature and under high pressure (for example, about 150–200° C. and about 30–40 kg/cm$^2$) to form the first stacked board 20.

Figure 5:
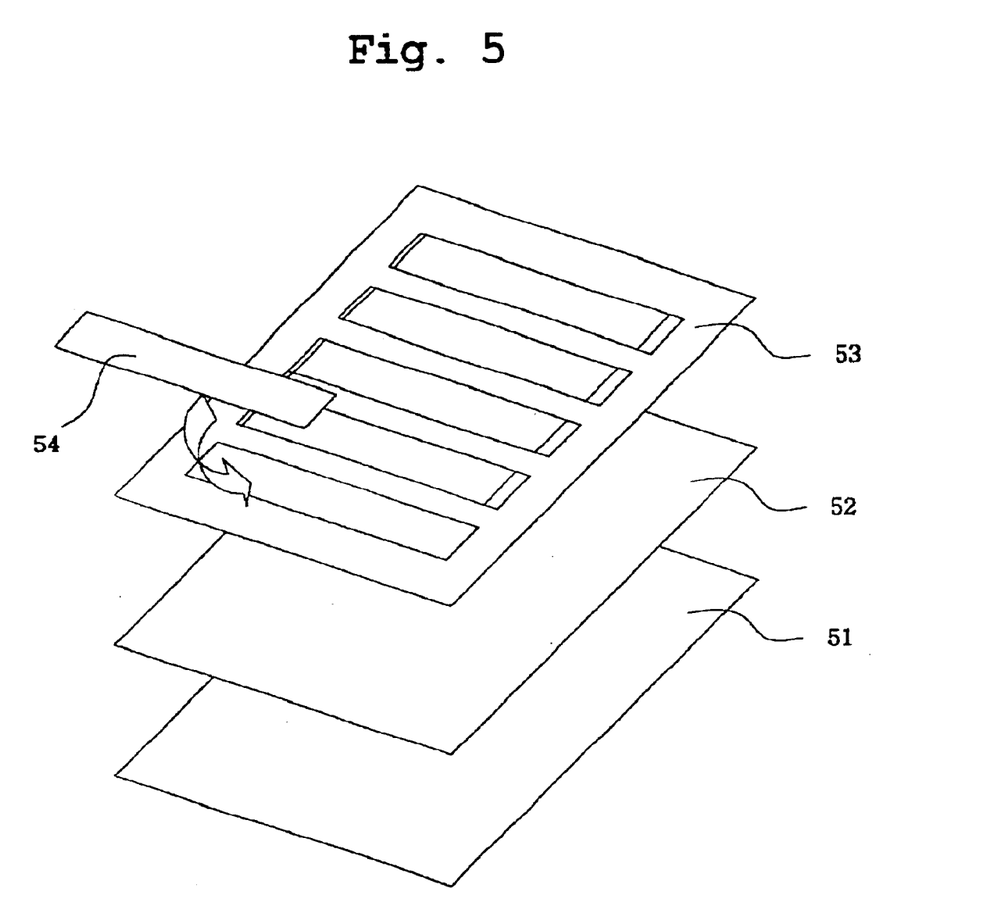
FIG. 5 shows a lay-up process of a first stacked board according to the present invention.

FIG. 5 shows an embodiment of a lay-up to be fabricated into a base layer of work size. An actual finished product is generally formed into a strip including a weak-magnetic field sensor unit. Referring to the drawing, there is shown a lay-up procedure of five magnetic ribbons 54. In this case, a magnetic ribbon 54 is used to fabricate a strip including a plurality of units. Accordingly, a size of the magnetic ribbon is determined depending on a size of a strip. However, where being fabricated into a strip, it is necessary to arrange the magnetic ribbons 54 on a prepreg 52 in a subsequent patterning procedure of the magnetic layer such that a plurality of units can be fabricated all at once. Accordingly, in the embodiment, a copper foil 53 on which the magnetic ribbons are to be arranged is positioned to carry out a preliminary lay-up. It is possible to use two methods of fabricating the copper foil. That is, there are a method of removing a portion of desired size by pressing a magnetic plate with a metal mold, and a method of removing a portion of a desired size by a rotating tool using a router process which is one of general processes of fabricating base boards. In this case, a worked object must have a size larger than that of the magnetic ribbons 54. In this connection, it is preferable to work an object to be larger than the magnetic ribbons 54 by about 0.1–0.2 mm in one direction in consideration of working tolerance and a problem caused by a copper foil covered with magnetic ribbons. Considering an area of a strip occupied by actual products, since the magnetic ribbon 54 has a sufficient size, it is possible to conform the ribbon to a width of the strip. However, since one or more strips may be contained in a magnetic ribbon, a length of the magnetic ribbon is determined in an initial design.

Figure 4E:
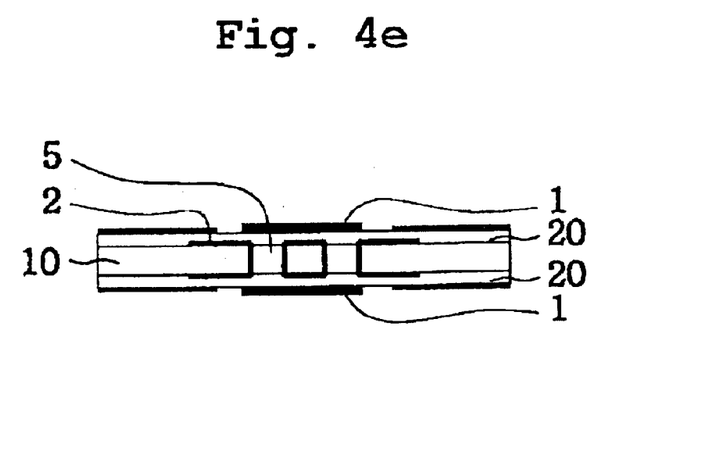
Figure 4F:
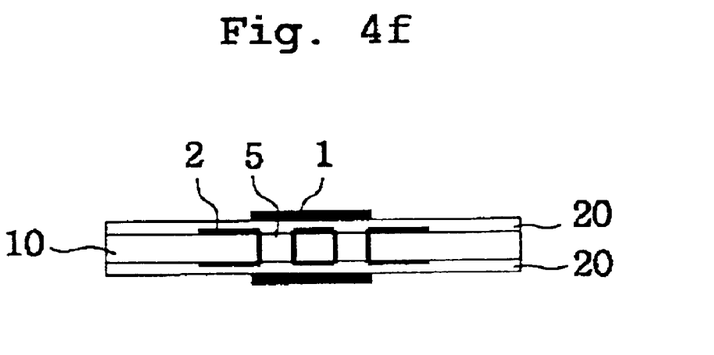

After completion of the first stacking, the first stacked boards 20 exhibits laminated boards in which the magnetic layers 13 are laminated on both sides of the base layer. At this point, although preferable thicknesses of the first base layers (prepreg) 22 and the magnetic layers 1 fall in ranges of about 0.06–0.1 mm and about 0.02–0.03 mm, the thicknesses may be varied depending on desired characteristics of finished products. Subsequently, the first stacked boards 20 are formed at outer surfaces with dry films (or photoresists), and the dry film layers are subjected to exposure and developing treatments according to magnetic patterns designed in advance. The dry film layers patterned in certain shapes serve as masks for etching the magnetic layers 1 (FIG. 4*e*). The exposure, development and etching techniques are well known in the art. As a result, only the magnetic strips 1 patterned in a certain pattern remain on the second base boards, thereafter, the dry film layers are stripped (FIG. 4*f*).

Figure 4G:
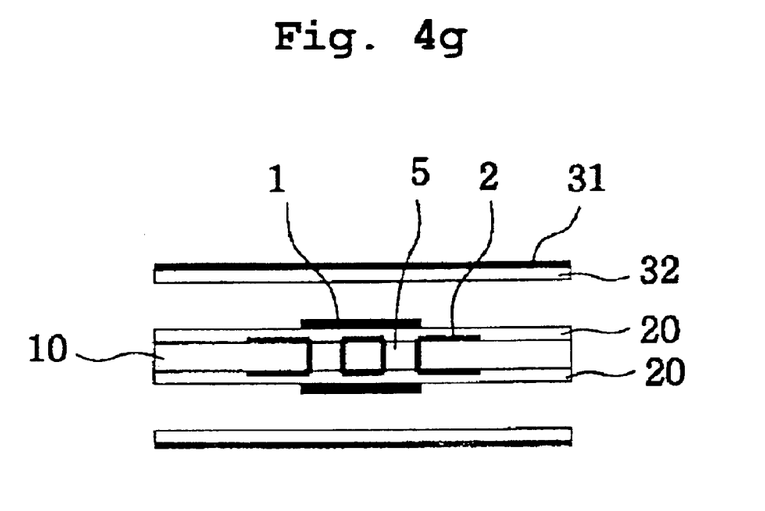
Figure 4H:
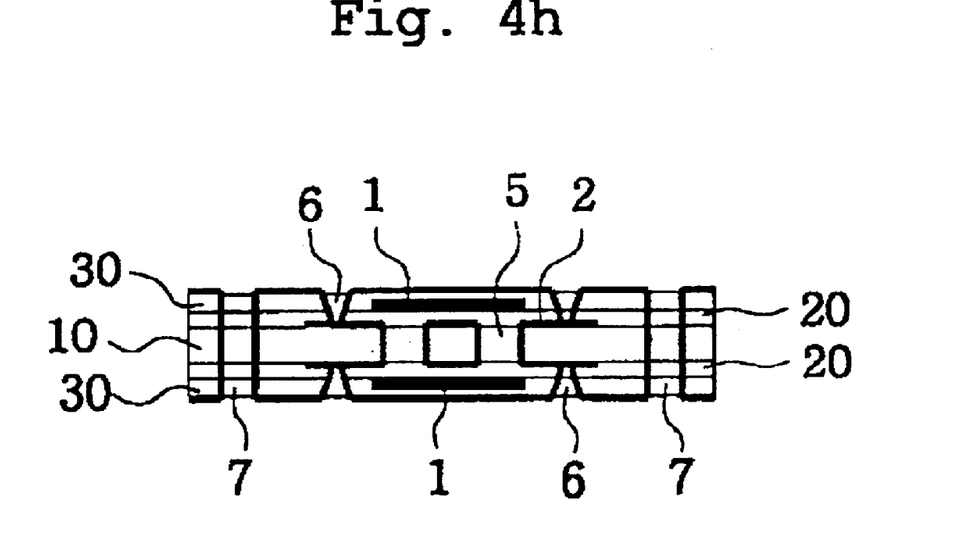
Figure 4I:
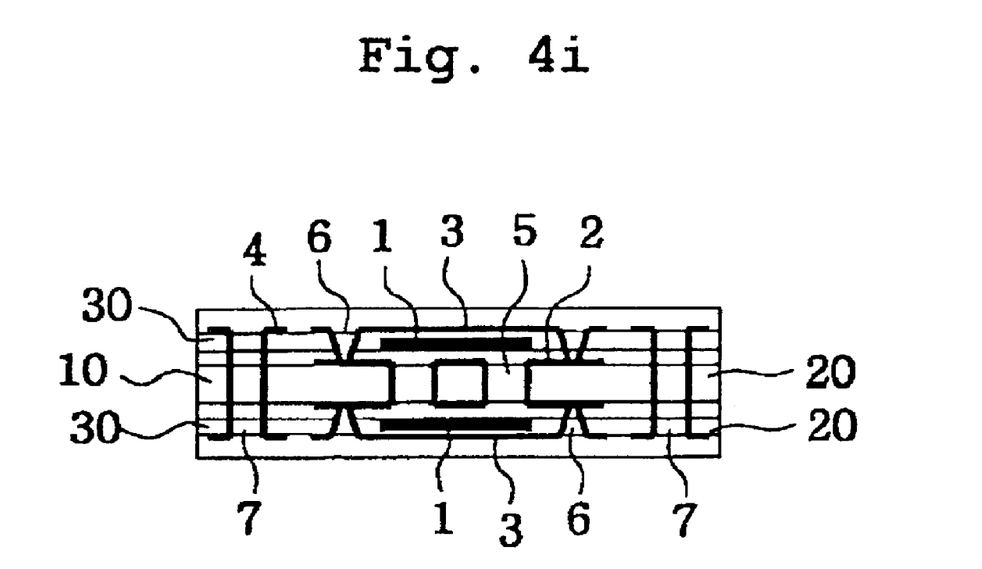

After completion of the patterning procedure for the magnetic layers of the first stacked boards 20, third base layers (or prepregs) 32 and third conductive layers (or copper foils) 31 are temporarily placed on the first stacked boards 20 (preliminary lay-up), and the laminated layers 32 and 31 are pressed at high temperature and under high pressure (for example, about 150–200° C. and about 30–40 kg/cm$^2$) to form second stacked boards 30 (FIG. 4*g*). Subsequently, the second stacked boards 30 are formed with second via-holes 6 by drills to be in contact with the first driving patterns 2 such that the first and second driving patterns 2 and 3 assume the shape of coils wound around the magnetic strips 1. The first base board 10, the first stacked boards 20 and the second stacked boards 30 are formed with through holes 7 such that upper and lower pickup patterns 4 are electrically connected to each other. The through holes 7 are plated at inner surfaces thereof with conductive metal (i.e., copper) (FIG. 4*h*). Thereafter, the second stacked boards are formed at outer surfaces thereof with the second driving patterns 3 and the pickup patterns 4 by known manufacturing procedures of printed circuit boards, i.e., exposure, developing and etching techniques (FIG. 4*i*). The second driving patterns 3 and the first driving patterns 2 disposed between the upper and lower magnetic strips 1 are electrically connected to each other by the first and second via-holes 5 and 6 so that the first and second driving patterns 2 and 3 surround the magnetic strips 1, thereby serving as driving coils for the flux gate sensor. Furthermore, the upper and lower pickup patterns 4 are electrically connected to each other by the through holes 7 to surround the first and second driving patterns 2 and 3, thereby serving as pickup coils for the flux gate sensor.

Thereafter, to prevent the patterned conductive layers (i.e., copper circuits) exposed to outside from being oxidized by humidity etc., solder mask is selectively applied to all areas excepting the conductive layers, and the conductive layers are formed with nickel (or nickel-phosphor) plated layers and gold plated layers, in this order. Specifics of such procedures are well known in the art of printed circuit boards.

As mentioned previously, the conductive layers 31 used in the stacking procedures of the second stacked boards 30 are preferably made of copper foils. As the copper foils, standardized copper foils of thickness 12 $\mu$m, 18 $\mu$m, 35 $\mu$m and so on may be used. However, where copper foils of thickness 35 $\mu$m are used, it is required to reduce the thickness of the copper foils to at least about 5–7 $\mu$m by a half-etching so as to form circuit patterns after the stacking procedure and before the drilling procedure.

Since the weak-magnetic field sensors using printed circuit board manufacturing technique according to the present invention are arranged in only one axial direction, it is possible to find an orientation relative to only the one axis. Accordingly, it is possible to find orientations relative to two axes by arranging two printed circuit boards to be perpendicular to each other.

The weak-magnetic field sensors using printed circuit board manufacturing technique according to the present invention can be broadly used in automobiles, aircraft, game machines, and toy robots as well as mobile phones and mobile terminals which are intended to detect the Earth's magnetic field to determine its positional information.

As described above, the present invention provides a weak-magnetic field sensor using printed circuit board manufacturing technique and a method of manufacturing the same, which is manufactured in such a way that circuits are formed on base boards having magnetic strips by etching etc., and driving and pickup patterns are formed thereon so as to detect weak-magnetic fields.

According to the present invention, since circuits are precisely formed on base boards for detecting weak-magnetic fields by etching and so on, it is possible to obtain precise attributes, and it is possible to reduce effects by variance of attributes by maintaining positional accuracy.

In addition, since the present invention can provide a weak-magnetic field sensor, which is miniaturized and consumes little electric power, the sensor can be easily adopted in small-sized electric appliances such as mobile phones.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A weak-magnetic field sensor using printed circuit board manufacturing technique comprising:
   a first base board which is formed at its upper and lower surfaces with first upper and lower driving patterns such that the skit upper and lower driving patterns are electrically connected to each other;
   a pair of first stacked boards which are stacked on upper and lower surfaces of the first base board and which are formed with magnetic layers to be parallel to each other; and
   a pair of second stacked boards which are stacked on outer surfaces of the pair of first stacked boards and which are formed with second driving patterns electrically connected to the first driving patterns of the first base board to surround magnetic layers and formed with pickup patterns to surround the first and second driving patterns.

2. The weak-magnetic field sensor as set forth in claim 1, in which the first base board is comprised of CCL (Copper Clad Laminate).

3. A weak-magnetic field sensor using printed circuit board manufacturing technique which is configured by arranging the two weak-magnetic field sensors of claim 2 to be perpendicular to each other and attaching the two weak-magnetic field sensors to each other.

4. The weak-magnetic field sensor as set forth in claim 1, in which material of the magnetic layer is selected from a group consisting of amorphous metal, Permalloy and Supermalloy.

5. A weak-magnetic field sensor using printed circuit board manufacturing technique which is configured by arranging the two weak-magnetic field sensors of claim 4 to be perpendicular to each other and attaching the two weak-magnetic field sensors to each other.

6. The weak-magnetic field sensor as set forth in claim 1, in which the patterned magnetic layer is selected from a group consisting of a pair of parallel magnetic bands with a spacing, a single magnetic band and a rectangular magnetic strip.

7. A weak-magnetic field sensor using printed circuit board manufacturing technique which is configured by arranging the two weak-magnetic field sensors of claim 6 to be perpendicular to each other and attaching the two weak-magnetic field sensors to each other.

8. The weak-magnetic field sensor as set forth in claim 1, in which the upper and lower patterned magnetic layers are formed into band shapes and arranged to be parallel to each other in the same direction, and the first and second driving patterns and the pickup patterns are oriented to be perpendicular to the magnetic layers.

9. A weak-magnetic field sensor using printed circuit board manufacturing technique which is configured by arranging the two weak-magnetic field sensors of claim 8 to be perpendicular to each other and attaching the two weak-magnetic field sensors to each other.

10. The weak magnetic field sensor as set forth in claim 1, in which the second driving patterns and the pickup patterns formed at the same surface are comprised of a plurality of parallel straight patterned lines arranged alternately, and the pickup patterns are sized to be longer than the driving patterns.

11. The weak-magnetic field sensor as set forth in claim 10, in which the patterned lines of the upper and lower pickup patterns are electrically connected to each other in a zigzag manner by the through holes to farm a coil comprised of a single line wound around the driving patterns.

12. A weak-magnetic field sensor using printed circuit board manufacturing technique which is configured by arranging the two weak-magnetic field sensors of claim 11 to be perpendicular to each other and attaching the two weak-magnetic field sensors to each other.

13. A weak-magnetic field sensor using printed circuit board manufacturing technique which is configured by arranging the two weak-magnetic field sensors of claim 10 to be perpendicular to each other and attaching the two weak-magnetic field sensors to each other.

14. The weak-magnetic field sensor as set forth in claim 1, in which the first base board is formed with first via-holes such that the first driving patterns formed at both sides of the first stacked board are electrically connected to each other, the first and second stacked boards are formed with second via-holes such that the first and second driving patterns are electrically connected to each other, and the first base board and the first and second stacked boards are formed with through holes such that the upper and lower pickup patterns are electrically connected to each other.

15. A weak-magnetic field sensor using printed circuit board manufacturing technique which is configured by arranging the two weak-magnetic field sensors of claim 14 to be perpendicular to each other and attaching the two weak-magnetic field sensors to each other.

16. A weak-magnetic field sensor using printed circuit board manufacturing technique which is configured by arranging the two weak-magnetic field sensor of claim 1 to be perpendicular to each other and attaching the two weak-magnetic field sensors to each other.

17. A method of manufacturing a weak-magnetic field sensor using printed circuit board manufacturing technique, comprising the steps of:

providing first driving patterns on upper and lower surfaces of a first base board by forming first via-holes at the first base board to connect the upper and lower driving patterns to each other followed by plating of the via-holes, exposing and etching;

preparing first stacked boards by stacking and pressing second base layers and magnetic layers on both sides of the first base board followed by exposing, developing and etching;

preparing second stacked boards by stacking and pressing second base layers and conductive layers on both sides of the first stacked board;

forming second via-holes at the first and second stacked boards, and forming through holes at the first base board and the first and second stacked boards; and providing second driving patterns on the second stacked boards to be electrically connected to the first driving patterns by the second via-holes and to surround the magnetic layers, and providing pickup patterns on the upper and lower second stacked boards to be electrically connected to each other by the through holes and to surround the first driving patterns by plating, exposing, developing and etching the second stacked board.

18. The method as set forth in claim 17, in which the magnetic layers are formed into ribbon shapes; and, prior to the step of preparing the first stacked board, further comprising a step of carrying out a preliminary lay-up to allow the ribbon-shaped magnetic layers to be stacked at predetermined positions of the second base layers.

19. The method as set forth in claim 17, in which the first base layer and the second base layer are comprised of prepregs.

20. The method as set forth in claim 19, in which the prepreg is selected from a group consisting of FR-4, FR-4 having high glass transition temperature (Tg) and bismaleimide-triazine (BT) epoxy resin.

21. The method as set forth in claim 17, in which the step of providing the pickup patterns comprises electrically connecting the patterned lines of the upper and lower pickup patterns to each other in a zigzag manner by the through holes to form a coil comprised of a single line surrounding the driving patterns.

22. A weak-magnetic field sensor using printed circuit board manufacturing technique comprising a second driving pattern and a pickup pattern (first layer), a magnetic layer (second layer), a first driving pattern (third layer), a first driving pattern (fourth layer), a magnetic layer (fifth layer) and a second driving pattern and a pickup pattern (sixth layer) from top to bottom in this order.

23. A weak-magnetic field sensor using printed circuit board manufacturing technique which is configured by arranging the two weak-magnetic field sensors of claim 22 to be perpendicular to each other and attaching the two weak-magnetic field sensors to each other.

* * * * *